United States Patent
Pourrahimi

(10) Patent No.: US 9,190,197 B2
(45) Date of Patent: Nov. 17, 2015

(54) SUPERCONDUCTING MAGNET OPERATING IN OCCASIONAL IDLING MODE

(71) Applicant: Shahin Pourrahimi, Brookline, MA (US)

(72) Inventor: Shahin Pourrahimi, Brookline, MA (US)

(*) Notice: Subject to any disclaimer, the term of this patent is extended or adjusted under 35 U.S.C. 154(b) by 162 days.

(21) Appl. No.: 14/191,222

(22) Filed: Feb. 26, 2014

(65) Prior Publication Data

US 2015/0243423 A1    Aug. 27, 2015

(51) Int. Cl.

| | |
|---|---|
| *H01F 6/00* | (2006.01) |
| *H01F 6/06* | (2006.01) |
| *H01F 6/04* | (2006.01) |
| *G01R 33/3815* | (2006.01) |
| *G01R 33/46* | (2006.01) |
| *G01R 33/48* | (2006.01) |
| *H01L 23/44* | (2006.01) |

(52) U.S. Cl.
CPC ............ *H01F 6/003* (2013.01); *G01R 33/3815* (2013.01); *G01R 33/46* (2013.01); *G01R 33/48* (2013.01); *H01F 6/04* (2013.01); *H01F 6/06* (2013.01); *H01L 23/445* (2013.01)

(58) Field of Classification Search
CPC ....... F25D 3/005; F25D 3/10; G01R 33/3815; H01F 6/00; H01F 6/04; H01L 32/445; H01L 23/445
See application file for complete search history.

(56) References Cited

U.S. PATENT DOCUMENTS

| | | | | |
|---|---|---|---|---|
| 5,724,820 | A * | 3/1998 | Iwasa ................. | G01R 33/3815 62/383 |
| 7,301,343 | B1 * | 11/2007 | Sellers ............... | G01R 33/3856 324/318 |
| 2002/0063616 | A1 * | 5/2002 | Ying ......................... | H01F 6/04 335/299 |
| 2013/0023418 | A1 * | 1/2013 | Ackermann .............. | F25B 9/10 505/162 |

* cited by examiner

*Primary Examiner* — Colleen Dunn
(74) *Attorney, Agent, or Firm* — Arjomand Law Group, PLLC

(57) ABSTRACT

Methods and systems are disclosed for saving energy while a superconducting magnet system is not being used and for reducing the time required for the re-establishment of the operating conditions of the system. Traditionally, during an inactive time interval, the temperature of the magnet coils is not allowed to rise, and the system is kept ON, in operating conditions. This results in wasting a large amount of energy for keeping the magnet coils at cryogenic temperatures. Turning the system OFF has never been an option since re-establishment of the operating conditions is very time consuming and costly. The present disclosure offers methods and systems that allow idling of a system in temperatures higher than the magnet coils' intended operating temperature, which results in noticeable savings.

19 Claims, 2 Drawing Sheets

SUPERCONDUCTING MAGNET OPERATING IN OCCASIONAL IDLING MODE

CROSS-REFERENCE(S) TO RELATED APPLICATION(S)

This application claims the benefit of the filing date of the U.S. Provisional Patent Application 61/813,442, entitled "Superconducting Magnet Operating in Occasional Idling Mode," filed on Apr. 18, 2013, the filing date of which is hereby claimed under 35 U.S.C. §119(e).

TECHNICAL FIELD

This application relates generally to magnets. More specifically, this application relates to an energy saving method when operating Superconducting Magnets.

BRIEF DESCRIPTION OF THE DRAWINGS

The drawings, when considered in connection with the following description, are presented for the purpose of facilitating an understanding of the subject matter sought to be protected.

DETAILED DESCRIPTION

While the present disclosure is described with reference to several illustrative embodiments described herein, it should be clear that the present disclosure should not be limited to such embodiments. Therefore, the description of the embodiments provided herein and the references to Magnetic Resonance Imaging (MRI) systems are examples of the systems utilizing superconducting magnets and are merely illustrative of the present disclosure and should not limit the scope of the disclosure as claimed. It will be appreciated by those skilled in the art that the disclosed methods are applicable to many other systems using superconducting magnets.

Briefly described, a method and a system are disclosed for saving energy in keeping many superconducting magnets appropriately cold, while a superconducting magnet is not being used, by discharging the magnet and keeping it in temperatures between the critical temperature of the magnet and the ambient temperature. Traditionally, even if a superconducting magnet system is not being actively used for a while, whether a weekend or a month, the temperature of the "Cold Mass," which is defined as the coils and structure components that operate at below critical temperature of the coils, is not allowed to rise above critical temperature of the superconducting coils of the superconducting magnet system.

MRI scanners are used for biomedical research and diagnosis of human disease and disorder. Imaging by an MRI scanner requires a very uniform, constant, and stable magnetic field over a specific volume. Conventionally, such a magnetic field, often referred to as a $B_0$ field, is produced by a permanent or superconducting magnet. For human applications, MRI devices that use permanent magnets typically generate $B_0$ magnetic fields of less than 0.5 T, and for research on animals they generate less than 1.5 T. For higher resolution imaging, superconducting magnets need to produce higher magnetic fields. Superconducting $B_0$ magnets use coils which must be maintained at cryogenic temperatures that are lower than the critical temperature of the superconducting coils. Conventionally, to achieve this, the coils of a superconducting MRI magnet operate in a pool/bath of boiling liquid helium under close to 1 atmosphere of pressure that keeps the coils at about 4.2K. Typically, the liquid helium fills parts of the helium vessel and the rest is helium vapor that is allowed to vent to ambient atmosphere.

Figure 1:
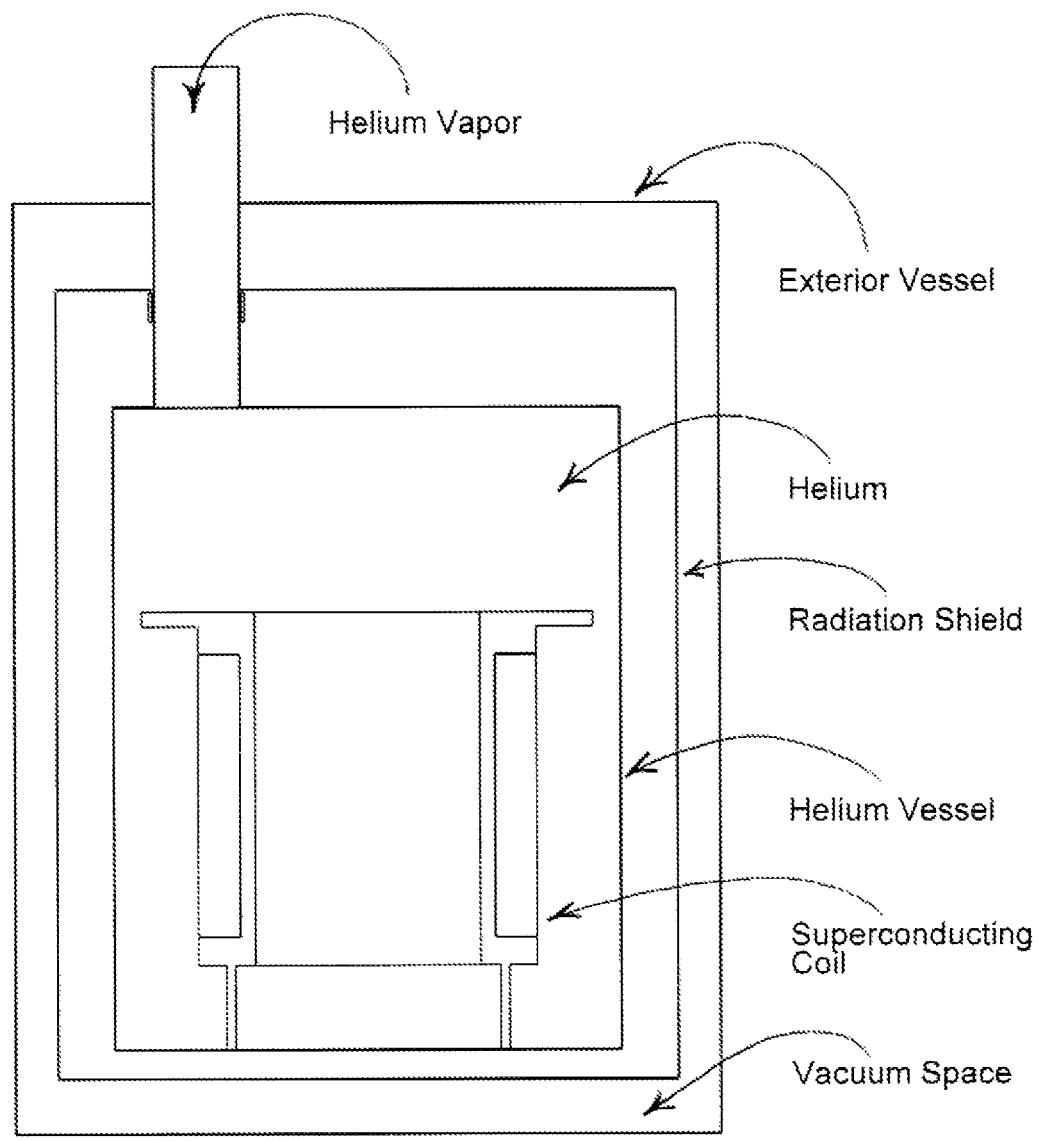
FIG. 1 shows a schematic diagram of a superconducting magnet in a pool of liquid helium.

As shown in FIG. 1, the helium vessel is surrounded by a radiation shield and both, the helium vessel and the surrounding radiation shield, are placed inside an exterior vessel. The exterior vessel includes certain vacuum space. The vessel, the radiation shield, the liquid helium vessel, and certain other parts are called a "Cryostat." The cryostat reduces and minimizes heat transfer to the helium vessel. But inevitably there is heat transfer to helium vessel and eventually to the liquid helium bath by: 1) Conduction through structural members of the cryostat, radiation shield, and the helium vessel; 2) Radiation; and 3) Residual Partial Pressure in the vacuum space.

The heat transferred to the Liquid helium bath naturally keeps the liquid helium in boiling condition and, therefore, in continuous generation of helium vapor, which vents to the atmosphere. In certain superconducting magnets, called zero-boil-off systems, the vaporized helium gas is re-condensed to liquid helium by a cryocooler and returned to the liquid helium bath. Contrary to its name, zero-boil-off, the re-condensing is not 100% and some helium vapor vents to the atmosphere. In a superconducting magnet where the coils are placed in a liquid helium bath, whether the magnet is of zero-boil-off type or not, the temperature of the liquid helium is essentially constant because the liquid helium bath is at its boiling point, and the temperature can only change if all or most of the liquid helium vaporizes. For superconducting magnets that use liquid helium, the goal of the cryostat is to maintain the liquid helium in its vessel with the least amount of loss to the atmosphere.

There is no incentive to have the coils at any temperature appreciably above that of the boiling liquid helium. Because if the temperature increases, no liquid helium will remain in the vessel and superconducting coils will need to be discharged or be allowed to quench. In such a case, to revert back to the operating conditions, one needs to refill the helium vessel with liquid helium, which requires a significant effort. Also, since superconducting magnets in conventional MRI systems operate in persistent mode and stay charged, there is no benefit in discharging them at any time. The MRI superconducting magnets are only discharged to service the magnet. The charge and discharge of these magnets require significant time and effort and are typically avoided for as long as possible.

In order to achieve a constant magnetic field, superconducting magnets of MRI systems operate in the so called persistent mode, where the current circulates through a set of superconducting coils that are connected in series by superconducting joints to form a superconducting loop. Additionally, to reach persistent mode, the set of coils need to have a persistent switch. Principles of persistent mode operation are described, for example, in Superconducting Magnets, M. N. Wilson, Oxford University Press, New York, N.Y. (1983), Chapter 11.

There are many other superconducting magnets that operate in a direct current (DC) mode such as those used in Nuclear Magnetic Resonance (NMR) spectroscopy or particle accelerators, which preferably operate in persistent mode.

In conclusion, the conventional superconducting magnets, such as MRI superconducting magnets, stay charged with their coils in a pool of liquid helium. Again, there is no incentive to increase the temperature of the coils and discharge these systems because there is a significant penalty for increasing the temperature of these coils and discharging these magnets. Even in the zero-boil-off systems there is no incentive to slow down the cryocooler, because doing so will increase the rate of helium vapor venting through the cryostat. And if venting is restricted, the pressure inside the helium vessel will increase and will have serious implications. Therefore, customarily, the users of such systems leave their systems on, even when their systems stay idle.

Figure 2:
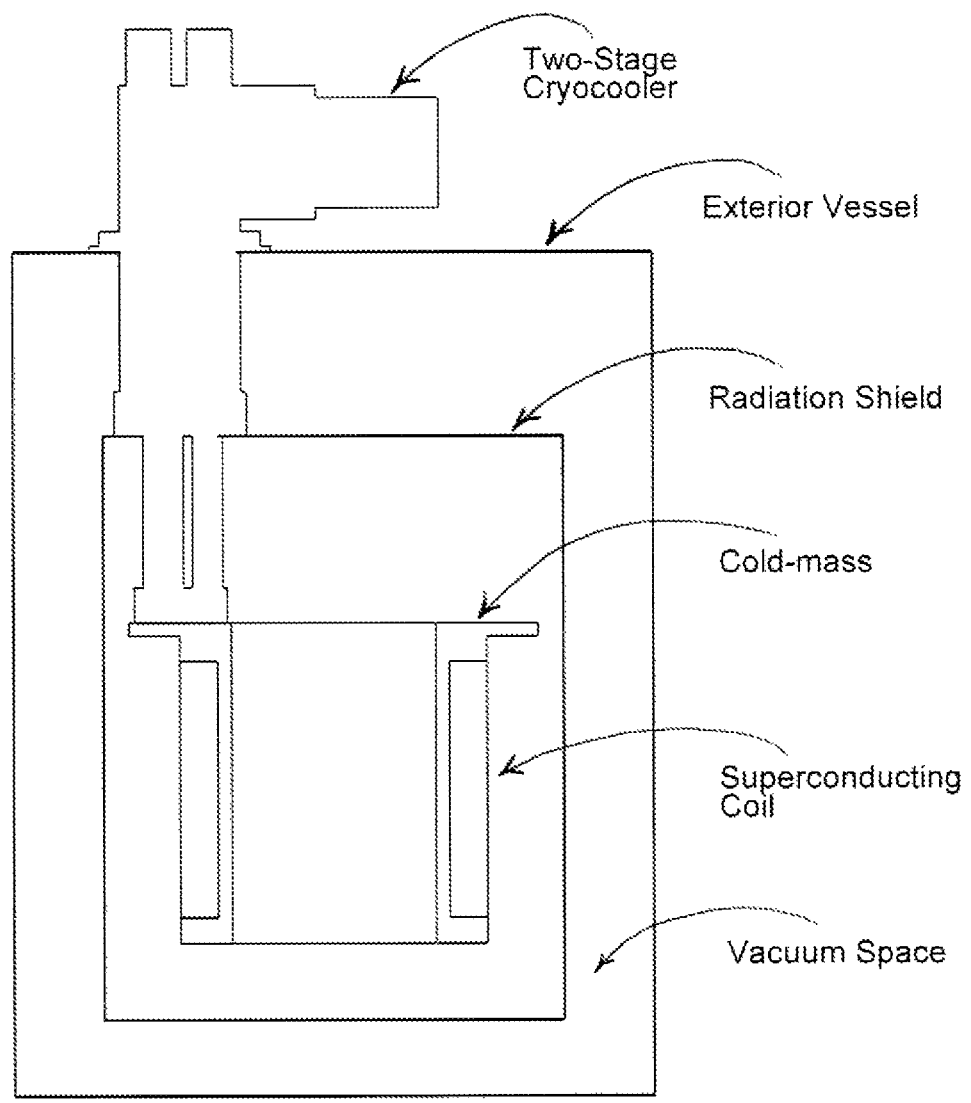
FIG. 2 shows a schematic diagram of a cryogen-free superconducting magnet.

An alternative to the class of liquid helium cooled superconducting magnets discussed above is the class of cryogen-free (CF) superconducting magnets. CF superconducting magnets are cooled to very low temperatures by one or more two-stage cryocoolers (also known as Cryo-Refrigerator) that make physical contact with selected parts of the magnet system and extract heat by conduction. This method of cooling is commonly referred to as cryogen free or conduction cooling. The amount of cooling (removal of heat) that is provided by a two-stage cryocooler can be a few tens of watts for the first stage to reach, for example, a temperature of 30° to 60° K., and a few watts for the second stage to reach, for example, 3° to 10° K. If the desired temperature is to be maintained, the amount of heat transferred (also known as heat leak) to the superconducting magnet from the environment should be reduced to or be lower than the cooling capacity of the cryocooler. Typically, a CF superconducting magnet includes several parts including a vacuum vessel, radiation shield, mechanical support structure, electrical connection, various sensors, valves, and coils made from superconducting wires. FIG. 2 shows a schematic diagram of a cryogen-free superconducting magnet.

For the superconducting magnet to operate properly and produce the required magnetic field, the temperature of the coils made from superconducting wires (superconducting coils), the structure, the connections that keep the coils together, need to be kept below the critical temperature of the superconducting coils. Similar to the liquid helium cooled superconducting magnet, in a CF superconducting magnets the superconducting coils, the structure, and the connections which keep the coils together may be referred to as "Cold-mass." The convection heat transfer to the cold-mass is reduced by removing the gases, such as air, which may surround the cold-mass. Air may be removed by housing the cold-mass inside a vacuum chamber. Radiation heat transfer is reduced by housing the cold-mass inside a radiation shield, which in turn is housed within the vacuum chamber. The radiation shield is cooled by the first stage of the cryocooler to a temperature of, for example, 30° to 60° K., and is usually covered on the side facing the vacuum chamber with several layers of reflective insulation, often referred to as "Super-Insulation." A conduction cooled systems is distinguished from a liquid helium cooled system by the fact that the cold-mass of the conduction cooled system and, therefore, its superconducting coils, operate in vacuum and that the temperature of the coils of the conduction cooled system can be allowed to increase without the penalties associated with handling of liquid helium or helium vapor.

According to the methods disclosed in this application, CF superconducting magnets, for example those in MRI systems, do not need to remain at a given temperature or stay charged even when they are not being used. To reach an "idle mode," these magnets are discharged and the temperature of their cold-masses is permitted to increase by making the cryocooler work at lower cooling capacity or even stop for periods of time, which in turn saves some energy that otherwise will be used by the cryocooler.

To prepare for the idling mode according to the present disclosure, the superconducting magnet is discharged by transferring its stored energy to heat exchangers outside of the magnet and by running the cryocooler at a lower cooling capacity. In the disclosed idling mode the temperature of the coils, while higher than the superconducting critical temperature, is not allowed to rise as high as the room temperature. However, during this process the temperatures of the first and the second stage of the magnet system reach higher values. For example, the temperature of the first stage parts, such as the radiation shield, may increase by 10° to 30° K., and the temperature of the second stage parts, such as coils, may also increase by 10° to 40° K. In the disclosed idling mode, the cryocooler power consumption will be significantly lower than it is during the superconducting mode.

According to this disclosure, an MRI magnet is shifted to idling mode when the magnet is not going to be used for an extended period of time, such as for days or weeks. In anticipation of the magnet reuse, the cooling system is switched from idling mode to full cooling mode, where the magnet cools to a superconducting state and is recharged. Recooling the first stage and the second stage by 10° to 40° K. can be achieved in a few hours rather than a few days that are required to cool a magnet down from room temperature. One of the key advantages of the disclosed idling mode, compared to keeping the magnet in superconducting state, is that a great amount of energy, which actually would have been wasted during an inactive time interval, is saved. As previously mentioned, the disclosed idling method may be applied to persistent mode superconducting magnets used in Nuclear Magnetic Resonance (NMR) spectroscopy applications as well. This method may also be applied to the so called driven superconducting magnets where the coils of the superconducting magnet are connected to a current power supply that charges the coils and keeps them charged.

Those skilled in the art will recognize that many known means and methods may be adopted to control the cold-mass temperature and keep the cold-mass at any desired temperature between the room temperature and cryogenic temperatures, during the idling mode. For example a programmable or a preprogrammed idling switch may be included in the disclosed superconducting magnet system which can be turned on to initiate the lowering of the cooling capacity of the first and the second stages of the cryocooler and maintain the cold-mass at a programmed temperature, and which can be turned off to cool down the cold-mass to a desired cryogenic temperature. A preprogrammed idling switch may have used software or be hardwired. In another example, a user of the system may manually, using a control mechanism, set the first and the second stage temperature increases of the cold-mass based on the planned idling time. In yet another example, a calibrated control component such as a knob, a dial, or a slide switch may be used to set the idling mode temperature based on tabulated energy savings.

Those skilled in the art will recognize that the cold-mass of a conduction cooled superconducting magnet system may include modules of materials that increase the heat capacity of the cold-mass so that during interruption to the cooling system the temperature of the cold-mass rises slower than otherwise. These modules may include metals, polymers, and ceramics. Also these modules may include hermetically sealed containers that contain gases such as neon, nitrogen, or helium.

Clearly the higher the idling temperature for the first stage and second stage of the cryocooler is the more energy is saved; however, more time will be needed to re-cool the system back to superconducting and therefore the operating mode (up-time). Therefore the overall operation of a CF superconducting magnet being able to switch to an idling mode may be such that to optimize the energy savings and the up-time of the magnet system. For example if the system is to be in idling mode just for a weekend, the first stage and the second stage of the magnet system may be set to idle at 20 K, and 50 K respectively, but if the system is to be idling for a week or more, the first stage and the second stage of the magnet system may be set to idle at 40 K, and 60 K. In the former case, re-cooling time or up-time is shorter than in the latter case, but the extra energy savings may justify the extra cooling time of the latter case. In various methods of controlling and or programming the idling temperatures the user of the CF superconducting magnet can decide on what are the optimum parameters for idling mode.

Changes can be made to the claimed invention in light of the above Detailed Description. While the above description details certain embodiments of the invention and describes the best mode contemplated, no matter how detailed the above appears in text, the claimed invention can be practiced in many ways. Details of the system may vary considerably in its implementation details, while still being encompassed by the claimed invention disclosed herein.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the claimed invention to the specific embodiments disclosed in the specification, unless the above Detailed Description section explicitly defines such terms. Accordingly, the actual scope of the claimed invention encompasses not only the disclosed embodiments, but also all equivalent ways of practicing or implementing the claimed invention.

The above specification, examples, and data provide a complete description of the manufacture and use of the composition of the invention. Since many embodiments of the invention can be made without departing from the spirit and scope of the invention, the invention resides in the claims hereinafter appended. It is further understood that this disclosure is not limited to the disclosed embodiments, but is intended to cover various arrangements included within the spirit and scope of the broadest interpretation so as to encompass all such modifications and equivalent arrangements. It will also be understood by those skilled in the art that single-stage coolers and/or multiple coolers may be adopted in various embodiments to achieve the same results discussed in this disclosure.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While the present disclosure has been described in connection with what is considered the most practical and preferred embodiment, it is understood that this disclosure is not limited to the disclosed embodiments, but is intended to cover various arrangements included within the spirit and scope of the broadest interpretation so as to encompass all such modifications and equivalent arrangements.

What is claimed is:

1. A Magnetic Resonance Imaging (MRI) system configured to occasionally stay in idling mode, the system comprising:
    a magnet coil configured to operate as a superconducting magnet in a desired cryogenic temperature;
    a cooler configured to cool the magnet coil to the desired cryogenic temperature;
    discharging, controllably, the magnet coil at least partially; and
    a control component to controllably discharge the magnet coil and to control idling mode temperatures of the cold-mass during the idling mode and controllably maintain cold-mass temperatures between the cryogenic temperature and ambient temperatures of the system.

2. The system of claim 1, wherein the control component is manual, software-programmed, hardwired, or programmable.

3. The system of claim 1, wherein the superconducting magnet operates in persistent mode.

4. The system of claim 1, wherein the superconducting magnet operates in driven mode.

5. The system of claim 1, wherein the cooler is a cryocooler.

6. A method of idling a superconducting magnet system, the method comprising:
    discharging, optionally, magnet coils, at least partially;
    increasing first stage temperature of a cryostat of the system by a first desired amount; and
    increasing second stage temperature of the cold-mass of the system by a second desired amount, wherein the second stage final temperature of the cold-mass is more than an intended temperature for operating the superconducting magnet system and less than ambient temperature of the superconducting magnet system.

7. The method of claim 6, wherein the first stage and the second stage increasing of temperatures are combined into a single stage.

8. The method of claim 6, wherein the magnet coils are either not discharged or partially discharged and the charge level is maintained.

9. The method of claim 6, wherein the cold-mass includes magnet coils, structure, and connections that keep the magnet coils together.

10. The method of claim 6, wherein the superconducting magnet system is cryogen-free and conduction-cooled.

11. A superconducting magnet configured to occasionally stay in idling mode, the superconducting magnet comprising:
 a magnet coil configured to operate as a superconducting magnet in a desired cryogenic temperature;
 a discharging system configured to at least partially discharge the magnet coil;
 a cooling system configured to cool the magnet coil to the desired cryogenic temperature; and
 a control mechanism to control discharging and to control idling mode temperatures of the magnet coil during the idling mode and controllably maintain magnet coil temperatures between the cryogenic temperature and ambient temperatures of the superconducting magnet.

12. The superconducting magnet of claim 11, wherein the cooler is a cryogen-free cooler.

13. The superconducting magnet of claim 11, wherein the superconducting magnet is conduction-cooled.

14. The superconducting magnet of claim 11, wherein the superconducting magnet includes added thermal heat capacity other than liquid helium.

15. The superconducting magnet of claim 11, wherein the superconducting magnet operates in persistent mode.

16. The superconducting magnet of claim 11, wherein the superconducting magnet operates in driven mode.

17. The superconducting magnet of claim 11, wherein the superconducting magnet is used in an MRI scanner.

18. The superconducting magnet of claim 11, wherein the superconducting magnet is used in an NMR spectrometer.

19. The superconducting magnet of claim 11, wherein the cooling system may include single-stage coolers or multiple coolers.

* * * * *